(12) United States Patent
Sanguinetti et al.

(10) Patent No.: US 10,564,552 B2
(45) Date of Patent: Feb. 18, 2020

(54) METHOD OF MEASURING A STRUCTURE, INSPECTION APPARATUS, LITHOGRAPHIC SYSTEM AND DEVICE MANUFACTURING METHOD

(71) Applicant: ASML Netherlands B.V., Veldhoven (NL)

(72) Inventors: Gonzalo Roberto Sanguinetti, Eindhoven (NL); Murat Bozkurt, Uden (NL); Maurits Van Der Schaar, Eindhoven (NL); Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/007,112

(22) Filed: Jun. 13, 2018

(65) Prior Publication Data

US 2018/0373166 A1 Dec. 27, 2018

(30) Foreign Application Priority Data

Jun. 26, 2017 (EP) .................................... 17177953

(51) Int. Cl.
  *G03B 27/42* (2006.01)
  *G03F 7/20* (2006.01)
  *G01B 11/27* (2006.01)

(52) U.S. Cl.
  CPC ........ *G03F 7/70625* (2013.01); *G01B 11/272* (2013.01); *G01B 2210/56* (2013.01)

(58) Field of Classification Search
  CPC ............. G03F 7/70525; G03F 7/70508; G03F 7/70633; G03F 9/7026; G03F 9/7088; G03F 9/7034
  See application file for complete search history.

(56) References Cited

U.S. PATENT DOCUMENTS

| | | |
|---|---|---|
| 2006/0033921 A1 | 2/2006 | Den Boef et al. |
| 2006/0066855 A1 | 3/2006 | Boef et al. |
| 2010/0201963 A1 | 8/2010 | Cramer et al. |
| 2010/0328655 A1 | 12/2010 | Den Boef |
| 2011/0027704 A1 | 2/2011 | Cramer et al. |
| 2011/0043791 A1 | 2/2011 | Smilde et al. |
| 2011/0069292 A1 | 3/2011 | Den Boef |

(Continued)

FOREIGN PATENT DOCUMENTS

| | | |
|---|---|---|
| EP | 3 336 605 A1 | 6/2018 |
| EP | 3 401 733 A1 | 11/2018 |
| WO | WO 2017/032534 A2 | 3/2017 |

*Primary Examiner* — Mesfin T Asfaw
(74) *Attorney, Agent, or Firm* — Sterne, Kessler, Goldstein & Fox P.L.L.C.

(57) ABSTRACT

Overlay error of a lithographic process is measured using a plurality of target structures, each target structure having a known overlay bias. A detection system captures a plurality of images (740) representing selected portions of radiation diffracted by the target structures under a plurality of different capture conditions ($\lambda 1$, $\lambda 2$). Pixel values of the captured images are combined (748) to obtain one or more synthesized images (750). A plurality of synthesized diffraction signals are extracted (744) from the synthesized image or images, and used to calculate a measurement of overlay. The computational burden is reduced compared with extracting diffraction signals from the captured images individually. The captured images may be dark-field images or pupil images, obtained using a scatterometer.

20 Claims, 7 Drawing Sheets

(56) References Cited

U.S. PATENT DOCUMENTS

| | | |
|---|---|---|
| 2011/0102753 A1 | 5/2011 | Van De Kerkhof et al. |
| 2012/0013881 A1 | 1/2012 | Den Boef et al. |
| 2012/0044470 A1 | 2/2012 | Smilde et al. |
| 2012/0123581 A1 | 5/2012 | Smilde et al. |
| 2012/0242970 A1 | 9/2012 | Smilde et al. |
| 2013/0258310 A1 | 10/2013 | Smilde et al. |
| 2013/0271740 A1 | 10/2013 | Quintanilha |
| 2015/0138523 A1 | 5/2015 | Jak et al. |
| 2016/0161864 A1 | 6/2016 | Middlebrooks et al. |
| 2017/0052454 A1 | 2/2017 | Jak et al. |

METHOD OF MEASURING A STRUCTURE, INSPECTION APPARATUS, LITHOGRAPHIC SYSTEM AND DEVICE MANUFACTURING METHOD

BACKGROUND

Field of the Invention

The present invention relates to methods and apparatus for metrology usable, for example, in the manufacture of devices by lithographic techniques, and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions (known as fields) that are successively patterned.

In lithographic processes, it is desirable frequently to make measurements of the structures created, e.g. for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g. intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large gratings, e.g. 40 µm by 40 µm, and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables measurement of overlay and other parameters on smaller targets. These targets can be smaller than the illumination spot and may be surrounded by product structures on a substrate. The intensities from the environment product structures can efficiently be separated from the intensities from the overlay target with the dark-field detection in the image-plane.

Examples of dark field imaging metrology can be found in patent applications US20100328655A1 and US2011069292A1 which documents are hereby incorporated by reference in their entirety. Further developments of the technique have been described in published patent publications US20110027704A, US20110043791A, US2011102753A1, US20120044470A, US20120123581A, US20120242970A1, US20130258310A, US20130271740A, US2015138523A1 and US2016161864A1. Typically in these methods it is desired to measure asymmetry as a property of the target. Targets can be designed so that measurement of asymmetry can be used to obtain measurement of various performance parameters such as overlay, focus or dose. Asymmetry of the target is measured by detecting differences in intensity between opposite portions of the diffraction spectrum using the scatterometer. For example, the intensities of +1 and −1 diffraction orders may be compared, to obtain a measure of asymmetry.

In order to reduce measurement time, known apparatuses for dark-field metrology have apertures and detection systems configured to detect simultaneously the radiation diffracted from component gratings in both X and Y directions, and to detect these different directions of diffraction independently. Thus, the need for separate detection steps in X and Y orientation is avoided. Examples of such techniques are included in the prior patent publications mentioned above, and also, for example, in unpublished patent applications EP16157503.0, EP16204457.2 and EP17169918.4, not published at the present priority date.

The radiation used to acquire diffraction signals in such apparatus can be broadband or narrowband radiation of various wavelengths (colors). Typically, a "recipe" is defined for each target type and measurement, which specifies the optimal combination of illumination and detection parameters, including the color of the inspection radiation. A particular concern is so-called "stack sensitivity", where the measurement is influenced by variations for example in the thickness or composition of layers forming part of the structure, causing uncertainty in the parameter of interest, such as overlay. The recipe is chosen to minimize this. Several studies have shown that combining information from multiple color acquisitions can significantly improve the accuracy of the method. For these and other reasons a color switching capability may be provided in commercial inspection apparatus.

In this context, new methods to obtain more accurate overlay measurements using information from multiple wavelengths are being developed. The above-mentioned patent publication US2016161864A1 describes a method for combining measurements made using two or more different colors, to obtain a measurement result that is more robust against process variations. The contents of that publication are hereby incorporated herein by reference. It will be appreciated that extracting the asymmetry information from multiple captured images to obtain the desired measurement magnitude (overlay in this case) multiplies the number of image processing operations is required for every measurement. This impacts both the computational power required and the complexity of the software architecture.

SUMMARY OF THE INVENTION

The present invention in a first aspect aims to provide alternative methods to obtain the benefit of measuring a performance parameter such as overlay under different capture conditions. Embodiments of the invention mitigate the increase in computational burden required by the known method.

The invention in a first aspect provides a method of determining a performance parameter of a process, the method including the following steps:

(a) obtaining a plurality of target structures that have been formed by the process, each target structure having a known bias related to said performance parameter, (b) using a detection system to capture a plurality of images representing selected portions of radiation diffracted by the target structures under a plurality of different capture conditions;

(c) combining pixel values of at least a subset of the captured images to obtain one or more synthesized images;

(d) extracting a plurality of synthesized diffraction signals from the synthesized image or images; and (e) using the synthesized diffraction signals to calculate a measurement of said performance parameter.

The invention further provides an inspection apparatus for determining a performance parameter of a process, the inspection apparatus comprising:

a support for a substrate on which are provided a plurality of target structures that have been formed by the process, each target structure having a known bias related to said performance parameter, an illumination system and a detection system which are together operable to capture images representing selected portions of radiation diffracted by the target structures under a plurality of different capture conditions;

a processing device arranged to combine pixel values of at least a subset of the captured images to obtain one or more synthesized images, to extract a plurality of synthesized diffraction signals from the synthesized image or images, and to use the synthesized diffraction signals to calculate a measurement of said performance parameter.

The process may for example be a lithographic process. The term "lithographic process" as used herein refers to any example of a process in which a pattern is applied to a layer on a substrate, and one or more physical or chemical processing steps are controlled by the applied pattern, to realize (directly or indirectly) functional features in a finished product. The performance parameter being measured may relate to performance of the patterning step, and/or the physical or chemical processing steps.

The inspection apparatus can be implemented applying optical systems and techniques known from the prior art, or using new apparatus. The inspection apparatus can be implemented for example using the above-mentioned dark-field imaging techniques, thereby obtaining the first and/or second diffraction signals for a plurality of target structures in a single image.

The invention in another aspect provides a processing device arranged to receive a plurality of images captured from a plurality of target structures under different capture conditions and to derive a measurement of a performance parameter by combining pixel values of at least a subset of the captured images to obtain one or more synthesized images, extracting a plurality of synthesized diffraction signals from the synthesized image or images, and using the synthesized diffraction signals to calculate a measurement of said performance parameter.

The invention further provides one or more computer program products comprising machine readable instructions for causing a programmable processing device to implement one or more aspects of the invention as set forth above. The machine-readable instructions may be embodied, for example, in a non-transitory storage medium.

The machine-readable instructions may be further arranged to cause the programmable processing device to control automatically the operation of an inspection apparatus to cause capture of the diffraction signals by step (b) of the method.

The invention further provides a lithographic system including a lithographic apparatus and an inspection apparatus according to the second aspect of the invention, as set forth above.

The invention further provides a method of manufacturing devices wherein a device pattern is applied to a series of substrates using a process, the method including measuring one or more performance parameters using a plurality of target structures formed as part of or beside said device pattern on at least one of said substrates using a method according to the invention as set forth above, and controlling the process for later substrates in accordance with the result of the measuring.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

Embodiments of the invention will now be described, by way of example, with reference to the accompanying drawings in which:

FIG. 1 depicts a lithographic apparatus together with other apparatuses forming a production facility for semiconductor devices;

FIGS. 2($a$)-2($b$) illustrate schematically 2($a$) an inspection apparatus adapted to perform angle-resolved scatterometry and dark-field imaging inspection methods in accordance with some embodiments of the invention and 2($b$) an enlarged detail of the diffraction of incident radiation by a target grating in the apparatus of FIG. 2($a$);

FIGS. 3($a$)-3($c$) illustrate 3($a$) a segmented illumination profile, 3($b$) the production of diffraction signals in different directions under the segmented illumination profile and 3($c$) the layout of a prism device in a segmented detection system, all in the operation of one embodiment of the inspection apparatus of FIGS. 2($a$)-2($b$);

Figure 3A:
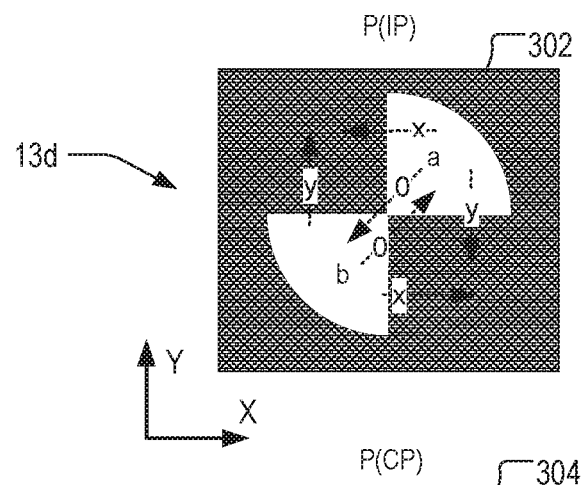
Figure 3B:
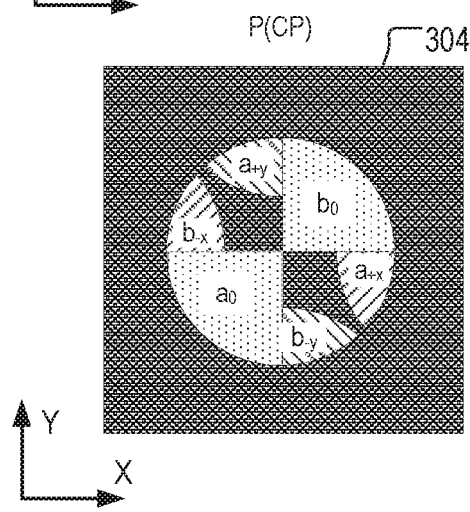
Figure 3C:
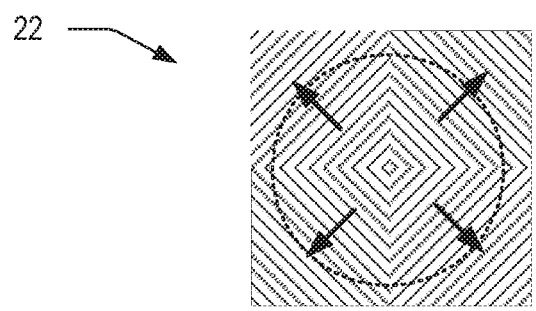
Figure 7:
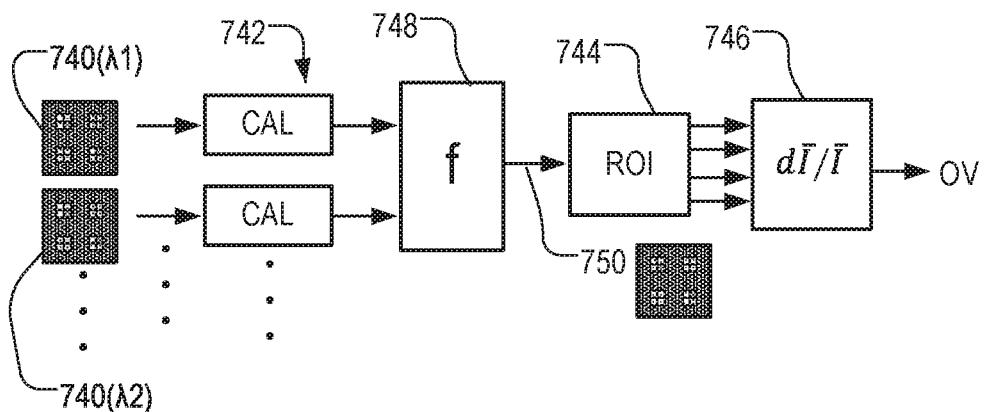
Figure 8:
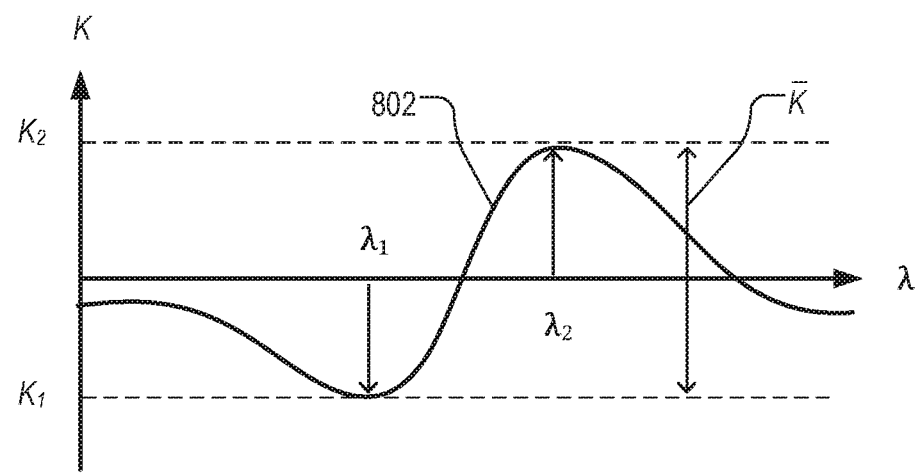
Figures 9A, 9B:
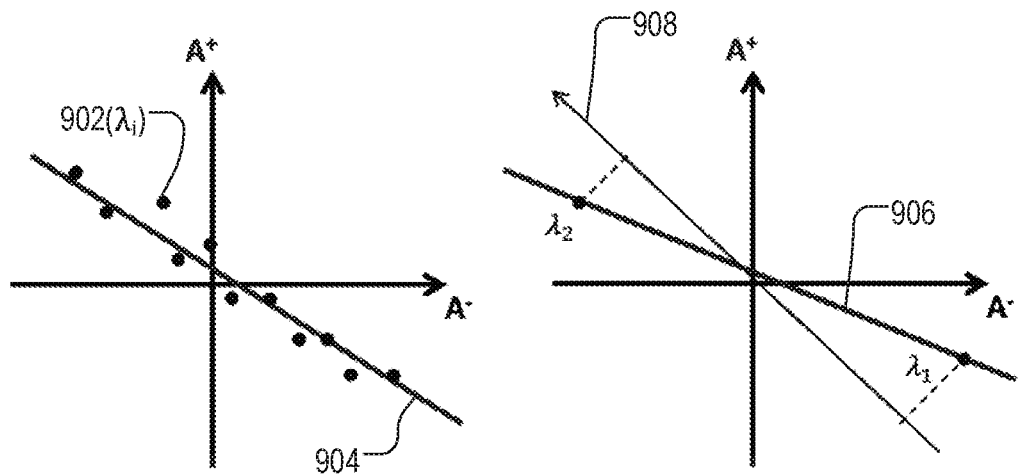
Figure 10:
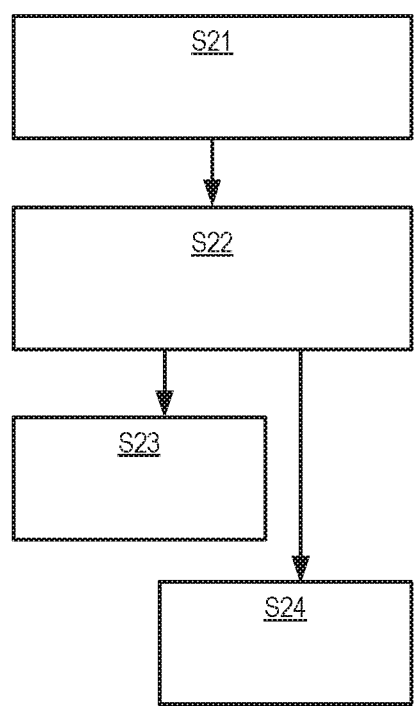

FIGS. 6($a$)-6($b$) illustrate 6($a$) a basic known method of deriving asymmetry-related parameters using the inspection apparatus of FIGS. 3($a$) and 3($b$) an enhanced method known from US2016161864A1;

FIG. 7 illustrates one embodiment of an enhanced method applying the principles of the present disclosure to measure an asymmetry-related parameter;

FIG. 8 illustrates a method of choosing capture conditions to maximize sensitivity of the method of FIG. 7;

FIGS. 9($a$) and 9($b$) illustrate the relationship between the method of FIG. 7 and the method known from US2016161864A1; and FIG. 10 is a flowchart of a method of measuring a property of a target structure and a method of controlling a process using the principles of the present disclosure.

DETAILED DESCRIPTION

Before describing embodiments of the invention in detail, it is instructive to present an example environment in which embodiments of the present invention may be implemented.

Figure 1:
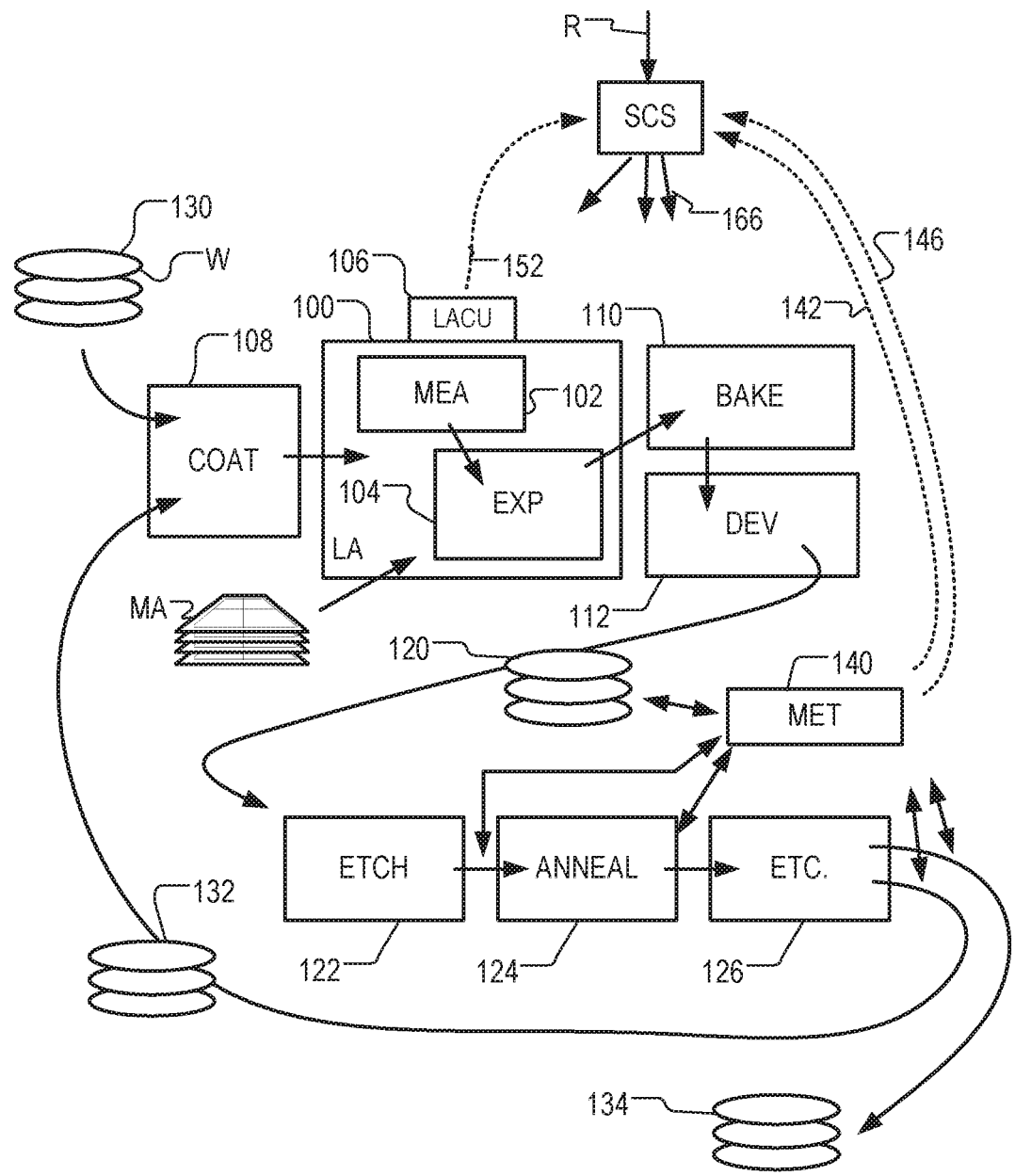

FIG. 1 at 100 shows a lithographic apparatus LA as part of an industrial facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls the movements and measurements of various actuators and sensors, causing the apparatus LA to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA for example is of a so-called dual stage type which has two substrate tables WTa and WTb and two stations—an exposure station and a measurement station—between which the substrate tables can be exchanged.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatuses can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. . . . . Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

The term "lithographic process" as used herein refers to any example of a process in which a pattern is applied to a layer on a substrate, and some physical or chemical processing step is controlled by the applied pattern to realize functional product features.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up, or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore, some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly, a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit LACU 106 making small adjustments over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

Example Inspection Apparatus

Figures 2A, 2B:
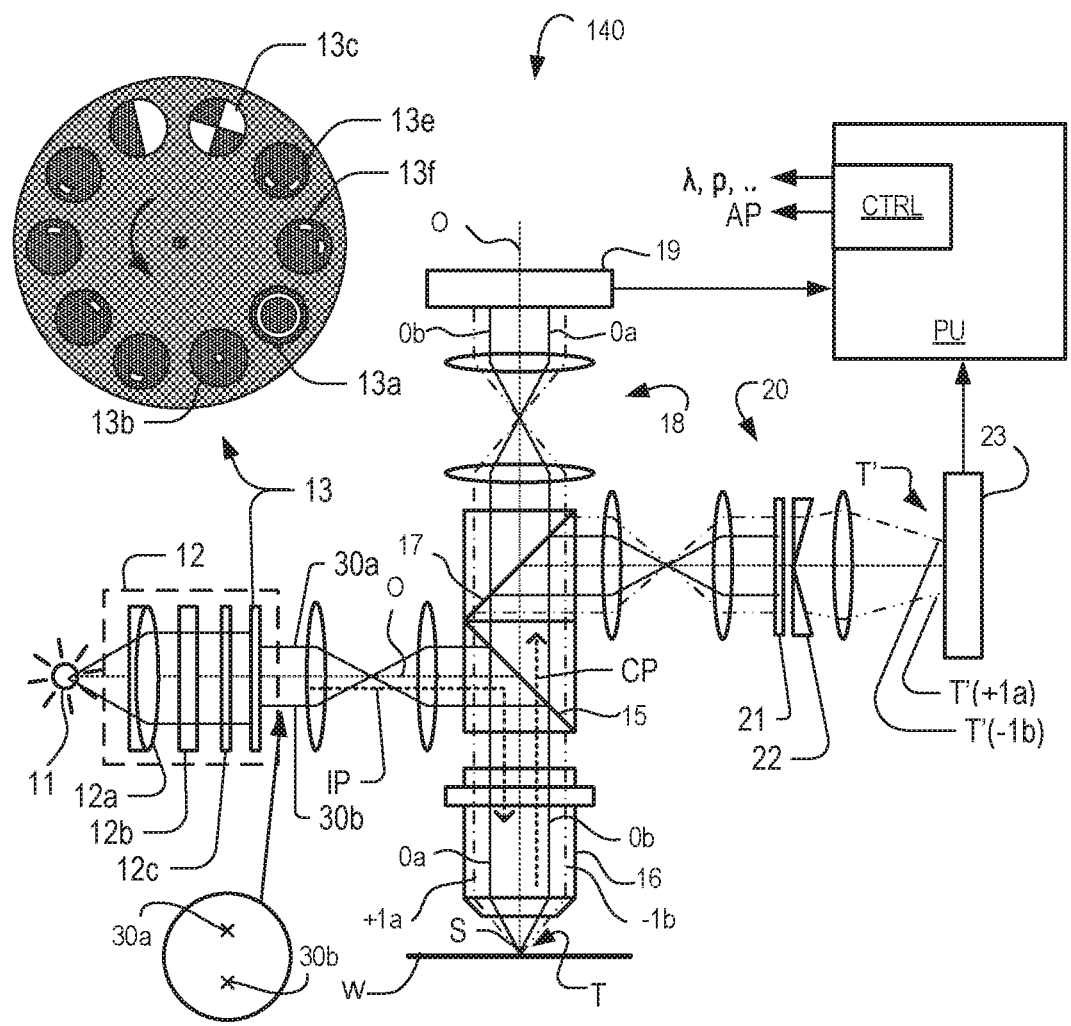

FIG. 2(a) shows schematically the key elements of an inspection apparatus implementing so-called dark field imaging metrology. The apparatus may be a stand-alone device or incorporated in either the lithographic apparatus LA, e.g., at the measurement station, or the lithographic cell LC. An optical axis, which has several branches throughout the apparatus, is represented by a dotted line O. A target grating structure T and diffracted rays are illustrated in more detail in FIG. 2(b).

As described in the prior applications cited in the introduction, the dark-field imaging apparatus of FIG. 2(a) may be part of a multi-purpose angle-resolved scatterometer that may be used instead of, or in addition to, a spectroscopic scatterometer. In this type of inspection apparatus, radiation emitted by a radiation source 11 is conditioned by an illumination system 12. For example, illumination system 12 may include a collimating lens system 12a, a color filter 12b, a polarizer 12c and an aperture device 13. The conditioned radiation follows an illumination path IP, in which it is reflected by partially reflecting surface 15 and focused into a spot S on substrate W via an objective lens 16. A metrology target T may be formed on substrate W. The objective lens 16 may be similar in form to a microscope objective lens, but has a high numerical aperture (NA), preferably at least 0.9 and more preferably at least 0.95. Immersion fluid can be used to obtain numerical apertures over 1 if desired.

The objective lens 16 in this example serves also to collect radiation that has been scattered by the target. Schematically, a collection path CP is shown for this returning radiation. The multi-purpose scatterometer may have two or more measurement branches in the collection path. The illustrated example has a pupil imaging branch comprising pupil imaging optical system 18 and pupil image sensor 19. An imaging branch is also shown, which will be described in more detail below. Additionally, further optical systems and branches will be included in a practical apparatus, for example to collect reference radiation for intensity normalization, for coarse imaging of capture targets, for focusing and so forth. Details of these can be found in the prior publications mentioned above.

Where a metrology target T is provided on substrate W, this may be a 1-D grating, which is printed such that, after development, the bars are formed of solid resist lines. The target may be a 2-D grating, which is printed such that after development, the grating is formed of solid resist pillars or vias in the resist. The bars, pillars or vias may alternatively be etched into the substrate. Each of these gratings is an example of a target structure whose properties may be investigated using the inspection apparatus. In the case of gratings, the structure is periodic. In the case of an overlay metrology target, the grating is printed on top of or interleaved with another grating that has been formed by a previous patterning step.

The various components of illumination system 12 can be adjustable to implement different metrology 'recipes' within the same apparatus. In addition to selecting wavelength (color) and polarization as characteristics of the illuminating radiation, illumination system 12 can be adjusted to implement different illumination profiles. The plane of aperture device 13 is conjugate with a pupil plane of objective lens 16 and with the plane of the pupil image detector 19. Therefore, an illumination profile defined by aperture device 13 defines the angular distribution of light incident on substrate W in spot S. To implement different illumination profiles, an aperture device 13 can be provided in the illumination path. The aperture device may comprise different apertures 13a, 13b, 13c etc. mounted on a movable slide or wheel. It may alternatively comprise a fixed or programmable spatial light modulator (SLM). As a further alternative, optical fibers may be disposed at different locations in the illumination pupil plane and used selectively to deliver light or not deliver light at their respective locations. These variants are all discussed and exemplified in the documents cited above. The aperture device may be of a reflective form, rather than transmissive. For example, a reflective SLM might be used. Indeed, in an inspection apparatus working in the UV or EUV waveband most or all of the optical elements may be reflective.

Depending on the illumination mode, example rays 30a may be provided so that the angle of incidence is as shown at 'I' in FIG. 2(b). The path of the zero order ray reflected by target T is labeled '0' (not to be confused with optical axis 'O'). Similarly, in the same illumination mode or in a second illumination mode, rays 30b can be provided, in which case the angles of incidence and reflection will be swapped compared with the first mode. In FIG. 2(a), the zero order rays of the first and second example illumination modes are labeled 0a and 0b respectively.

As shown in more detail in FIG. 2(b), target grating T as an example of a target structure is placed with substrate W normal to the optical axis O of objective lens 16. In the case of an off-axis illumination profile, a ray 30a of illumination I impinging on grating T from an angle off the axis O gives rise to a zeroth order ray (solid line 0) and two first order rays (dot-chain line+1 and double dot-chain line −1). It should be remembered that with an overfilled small target grating, these rays are just one of many parallel rays covering the area of the substrate including metrology target grating T and other features. Since the beam of illuminating rays 30a has a finite width (necessary to admit a useful quantity of light), the incident rays I will in fact occupy a range of angles, and the diffracted rays 0 and +1/−1 will be spread out somewhat. According to the point spread function of a small target, the diffracted radiation of each order +1 and −1 will be further spread over a range of angles, not a single ideal ray as shown.

If the target has multiple periodic components, then each of those will give rise to first and higher diffracted rays, which may be in directions into or out of the page. The example of FIG. 2(b) is merely describing a one-dimensional grating for simplicity.

In the branch of the collection path for dark-field imaging, imaging optical system 20 forms an image T' of the target on the substrate W on sensor 23 (e.g. a CCD or CMOS sensor). An aperture stop 21 is provided in a plane in the imaging branch of the collection path CP which is conjugate to a pupil plane of objective lens 16. Aperture stop 21 may also be called a pupil stop. Aperture stop 21 can take different forms, just as the illumination aperture can take different forms. The aperture stop 21, in combination with the effective aperture of lens 16, determines what portion of the scattered radiation is used to produce the image on sensor 23. Typically, aperture stop 21 functions to block the zeroth order diffracted beam so that the image of the target formed on sensor 23 is formed only from the first order beam(s). In an example where both first order beams were combined to form an image, this would be the so-called dark field image, equivalent to dark-field microscopy.

The images captured by sensor 23 are output to image processor and controller PU, the function of which will depend on the particular type of measurements being performed. For the present purpose, measurements of asymmetry of the target structure are performed. Asymmetry measurements can be combined with knowledge of the target structures to obtain measurements of performance parameters of lithographic process used to form them. Performance parameters that can be measured in this way include for example overlay, focus and dose. Special designs of targets are provided to allow these measurements of different performance parameters to be made through the same basic asymmetry measurement method.

Processor and controller PU also generates control signals such as λ and AP, for controlling the illumination characteristics (polarization, wavelength) and for selecting the aperture using aperture device 13 or a programmable spatial light modulator. Aperture stop 21 may also be controlled in the same way. Each combination of these parameters of the illumination and the detection is considered a "recipe" for the measurements to be made.

Referring again to FIG. 2(b) and the illuminating rays 30a, +1 order diffracted rays from the target grating will enter the objective lens 16 and contribute to the image recorded at sensor 23. Rays 30b are incident at an angle opposite to rays 30a, and so the −1 order diffracted rays enter the objective and contribute to the image. Aperture stop 21 blocks the zeroth order radiation when using off-axis illumination. As described in the prior publications, illumination modes can be defined with off-axis illumination in X and Y directions.

Apertures 13c, 13e and 13f in the aperture device 13 of FIG. 2(a) include off-axis illumination in both X and Y directions, and are of particular interest for the present disclosure. Aperture 13c creates what may be referred to as a segmented illumination profile, and may for example be used in combination with a segmented aperture defined for example by a segmented prism 22, described below. Apertures 13e and 13f may for example be used in combination with an on-axis aperture stop 21, in a manner described in some the prior published patent applications, mentioned above.

By comparing images of the target grating under these different illumination modes, asymmetry measurements can be obtained. Alternatively, asymmetry measurements could be obtained by keeping the same illumination mode, but rotating the target. While off-axis illumination is shown, on-axis illumination of the targets may instead be used and a modified, off-axis aperture stop 21 could be used to pass substantially only one first order of diffracted light to the sensor. In a further example, a segmented prism 22 is used in combination with an on-axis illumination mode. The segmented prism 22 can be regarded as a combination of individual off-axis prisms, and can be implemented as a set of prisms mounted together, if desired. These prisms define a segmented aperture in which rays in each quadrant are deflected slightly through an angle. This deflection in the pupil plane in has the effect of spatially separating the +1 and −1 orders in each direction in the image plane. In other words, the radiation of each diffraction order and direction forms an image to different locations on sensor 23 so that they can be detected and compared without the need for two sequential image capture steps. Effectively, separate images are formed at separated locations on the image sensor 23. In FIG. 2(a) for example, an image T'(+1a), made using +1 order diffraction from illuminating ray 30a, is spatially separated from an image T'(−1b) made using −1 order diffraction from illuminating ray 30b. This technique is disclosed in the above-mentioned published patent application US20110102753A1, the contents of which are hereby incorporated by reference in its entirety. 2nd, 3rd and higher order beams (not shown in FIG. 2) can be used in measurements, instead of, or in addition to, the first order beams. As a further variation, the off-axis illumination mode can be kept constant, while the target itself is rotated 180 degrees beneath objective lens 16 to capture images using the opposite diffraction orders.

Whichever of these techniques is used, the present disclosure applies to methods in which radiation diffracted in two directions, for example the orthogonal directions called X and Y, is simultaneously captured.

While a conventional lens-based imaging system is illustrated, the techniques disclosed herein can be applied equally with plenoptic cameras, and also with so-called "lensless" or "digital" imaging systems. There is therefore a large degree of design choice, which parts of the processing system for the diffracted radiation are implemented in the optical domain and which are implemented in the electronic and software domains.

Image-Based Asymmetry Measurement

Referring to FIG. 3 (a), and viewing the pupil plane of the illumination system P(IP) in the vicinity of aperture device 13, aperture 13c has been selected to define a specific spatial profile of illumination, illustrated at 902. In this desired spatial profile of the illumination system, two diametrically opposite quadrants, labeled a and b, are bright, while the other two quadrants are dark (opaque). This spatial illumination profile, when focused to form spot S on the target T, defines a corresponding angular distribution of illumination, in which rays from angles only in these two quadrants. This segmented type of aperture is known in scatterometry apparatus, from the published patent application US 2010/201963. The merits of this modified illumination aperture will be described further below.

When rays from the bright segments of the illumination profile 902 are diffracted by periodic features in a target structure, they will be at angles corresponding to a shift in the pupil plane. Arrows 'x' in FIG. 3 (a) indicate the direction of diffraction of illumination caused by structures periodic in the X direction, while arrows 'y' indicate the direction of diffraction of illumination caused by structures periodic in the Y direction. Arrows 'O' indicate direct reflection, in other words zero order diffraction. A feature of this segmented type of aperture is that, with regard to lines of symmetry defined by expected directions of diffraction (X and Y in this example), illuminated regions of the illumination profile are symmetrically opposite dark regions. Therefore there is the possibility to segregate the higher order diffracted radiation, while collecting radiation directed in both directions simultaneously.

FIG. 3 (b) illustrates a distribution of illumination in a conjugate pupil plane P(CP) in the collection path of the inspection apparatus. Assume firstly that the target T is a one-dimensional diffraction grating, with a periodicity in the X direction as a first direction. While the spatial profile 302 of the illumination has bright quadrants labeled a and b, the diffraction pattern resulting from diffraction by the lines of the target grating is represented by the pattern at 304 in FIG. 3 (b). In this pattern, in addition to zero order reflections labeled $a_0$ and $b_0$ there are first order diffraction signals visible, labeled $a_{+x}$, $b_{-x}$. Because other quadrants of the illumination aperture are dark, and more generally because the illumination pattern has 180° rotational symmetry, the diffraction orders $a_{+x}$ and $b_{-x}$ are "free", meaning that they do not overlap with the zero order or higher order signals from other parts of the illumination aperture (considering only the X direction at this stage). This property of the segmented illumination pattern can be exploited to obtain clear first order signals from a diffraction grating (alignment mark) having a pitch which is half the minimum pitch that could be imaged if a conventional, circularly-symmetric illumination aperture were used.

Zero order signals $a_0$ and $b_0$ are also present in the pupil of the collection system, as illustrated. Depending whether these zero order signals are wanted or not, they may be blocked by a segmented aperture stop 21, similar in form to aperture 13d. For asymmetry-based measurements, it is generally the higher order signals, for example the +1 and −1 order signals that are of interest.

FIG. 3 (c) shows schematically the layout of the segmented prism 22 in the imaging branch of the inspection apparatus of FIG. 2. The circular pupil P(CP) is represented by a dotted circle. In each quadrant of the pupil, a differently angled prism is provided, which deflects the radiation through a certain angle. This angular deflection in the pupil plane translates into a spatial separation of images in the plane of the detector 23, as illustrated already above with reference to FIG. 2(a). The operation of the apparatus in this type of configuration, and some practical benefits and challenges, will now be described in further. The principles of the present disclosure are applicable in other configurations, however.

Figure 4:
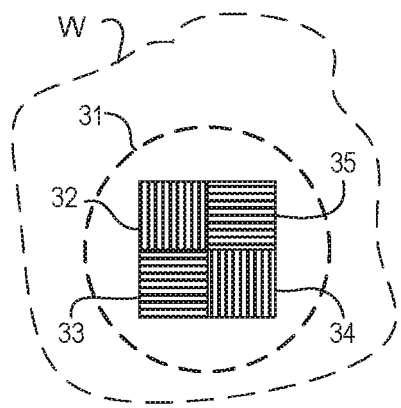
FIG. 4 illustrates a composite metrology target including a number of component gratings.

FIG. 4 depicts a composite metrology target formed on a substrate W according to known practice. The composite target comprises four target structures in the form of gratings 32 to 35 positioned closely together so that they will all be within the measurement spot S formed by the illumination beam of the metrology apparatus. A circle 31 indicates the extent of spot S on the substrate W. The four target structures thus are all simultaneously illuminated and simultaneously imaged on sensor 23. In an example dedicated to overlay measurement, gratings 32 to 35 are themselves overlay gratings formed by first features and second features that are patterned in different lithographic steps. For ease of description it will be assumed that the first features and second features are formed in different layers of the semiconductor device formed on substrate W, but they may alternatively be formed in one layer, for example as part of a multiple patterning process. Gratings 32 to 35 may be differently biased, meaning that they have designed-in overlay offsets additional to any unknown overlay error introduced by the patterning process. Knowledge of the biases facilitates measurement of overlay between the layers in which the different parts of the overlay gratings are formed. Gratings 32 to 35 may also differ in their orientation, as shown, so as to diffract incoming radiation in X and Y directions.

In one known example, gratings 32 and 34 are X-direction gratings with biases of +d, −d, respectively in the placement of one grating relative to another. This means that grating 32 has its overlying components arranged so that if they were both printed exactly at their nominal locations one of the components would be offset relative to the other by a distance d. Grating 34 has its components arranged so that if perfectly printed there would be an offset of d but in the opposite direction to the first grating and so on. Gratings 33 and 35 are Y-direction gratings with offsets +d and −d respectively. Separate images of these gratings can be identified in the image captured by sensor 23. While four gratings are illustrated, another embodiment might require a larger matrix to obtain the desired accuracy.

Figure 5:
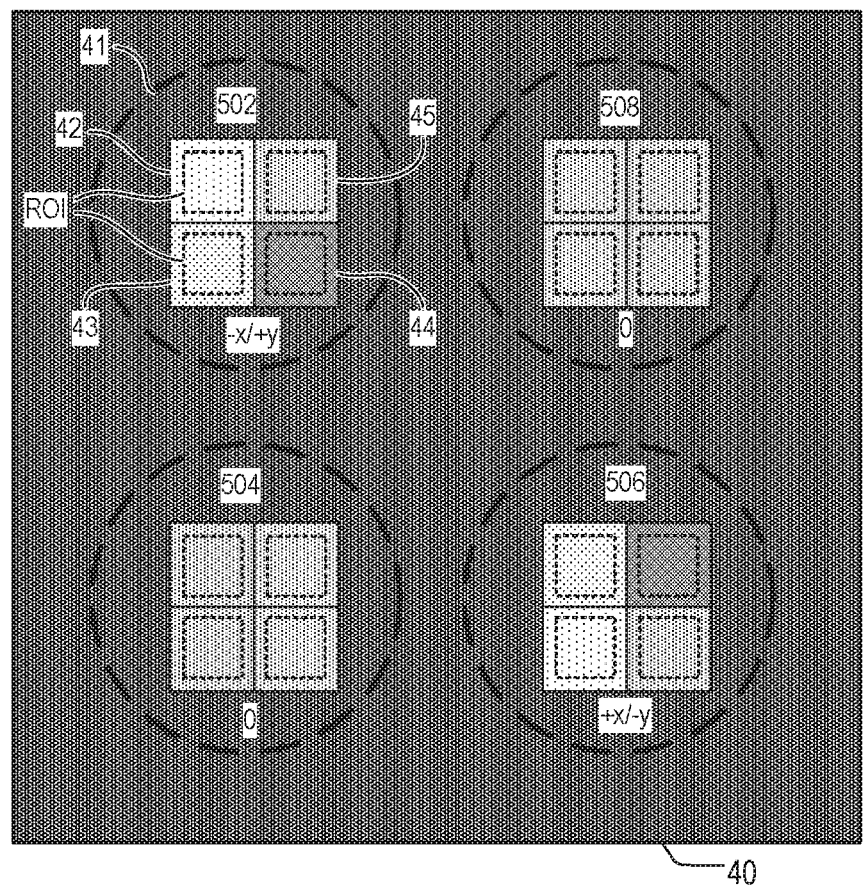
FIG. 5 illustrates a multiple image of the target of FIG. 4, captured by the apparatus of FIG. 4 with spatial separation of diffraction orders.

FIG. 5 shows an example of an image that may be formed on and detected by the sensor 23, using the target of FIG. 4 in the apparatus of FIGS. 2-3, using the segmented illumination profile and using the segmented prisms 22. Such a configuration provides off-axis illumination in both X and Y orientations simultaneously, and permits detection of diffraction orders in X and Y simultaneously, from the quadrants at upper left and lower right of the pupil 304 in FIG. 3(b).

The dark rectangle 40 represents the field of the image on the sensor, within which the illuminated spot 31 on the substrate is imaged into four corresponding circular areas, each using radiation only from one quadrant of the pupil 304 in the collection path CP. Four images of the target are labelled 502 to 508. Within image 502 the image of the illuminated spot 31 using radiation of the upper left quadrant of the pupil 304 is labelled 41. Within this, rectangular areas 42-45 represent the images of the small target gratings 32 to 35. If the gratings are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole.

As mentioned and as illustrated in FIG. 5, because of the action of the segmented prism 22 on the signals in the pupil 904 of the collection path, and because of the segmented illumination profile 902 and its orientation relative to the X and Y directions of the target T, each of the four images 502-508 uses only certain portions of the diffraction spectra of each target. Thus the images 504 and 508 at lower left and upper right respectively are formed of the zero order radiation $a_0$ and $b_0$ respectively. The image 502 is formed of higher order diffracted radiation, specifically radiation diffracted in the negative X direction from bright quadrant b and the positive Y direction from bright quadrant a (diffraction signals $a_{+y}$ and $b_{-x}$). Conversely, image 506 is formed of higher order diffracted radiation, specifically radiation diffracted in the positive X direction from bright quadrant b and the negative Y direction from bright quadrant a (diffraction signals $a_{-y}$ and $b_{+x}$).

In implementations not using the segmented illumination and segmented detection techniques descried above, darkfield images 502 and 506 may be captured separately, rather than in a single image. The principles of the present disclosure can be applied equally in either case. The principles of the present disclosure can be applied also in the case of large metrology using larger targets, and the pupil image sensor 19.

Assuming for simplicity that each target comprises only one-dimensional gratings, each component grating 31-35 diffracts radiation in only one of the two directions, and the image of each grating is spatially separated within the images 502-508 by the imaging action of the optical system. Once the separate images of the gratings have been identified, the intensities of those individual images can be measured, e.g., by averaging or summing selected pixel intensity values within the identified areas (ROIs). Intensities and/or other properties of the images can be compared with one another to obtain measurements of asymmetry for the four or more gratings simultaneously. These results can be combined with knowledge of the target structures and bias schemes, to measure different parameters of the lithographic process. Overlay performance is an important example of such a parameter, and is a measure of the lateral alignment of two lithographic layers. Overlay can be defined more specifically, for example, as the lateral position difference between the center of the top of a bottom grating and the center of the bottom of a corresponding top-grating.

To obtain measurements of other parameters of the lithographic process, different target designs can be used. Again, knowledge of the target designs and bias schemes can be combined with asymmetry measurements to obtain measurements of the desired performance parameter. Target designs are known, for example, for obtaining measurements of dose or focus from asymmetry measurements obtained in this way. The present disclosure is applicable to all of these asymmetry-based measurements, whether for overlay, focus, dose or some other parameter.

As mentioned above, the performance parameter being measured may relate to performance of the patterning step, for example overlay or focus, and/or performance of the physical or chemical processing steps which follow the patterning step. For example, an asymmetry can be introduced in the performance of an etching step, or a polishing step.

For cases where the target comprises gratings having two-dimensional structure, cross-talk between the diffraction orders of different gratings may occur. Additional techniques can be applied to obtain measurements specific to the two directions, for example as disclosed in the abovementioned applications EP16204457.2 and EP17169918.4, not published at the present priority date. The contents of those applications are hereby incorporated herein by reference, while details of those techniques are not relevant to an understanding of the present disclosure.

Enhanced Methods of Asymmetry Measurement

Figure 6A:
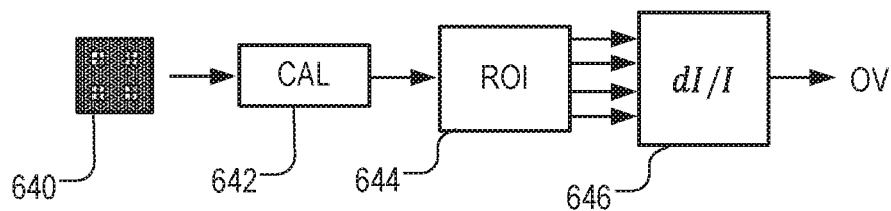
Figure 6B:
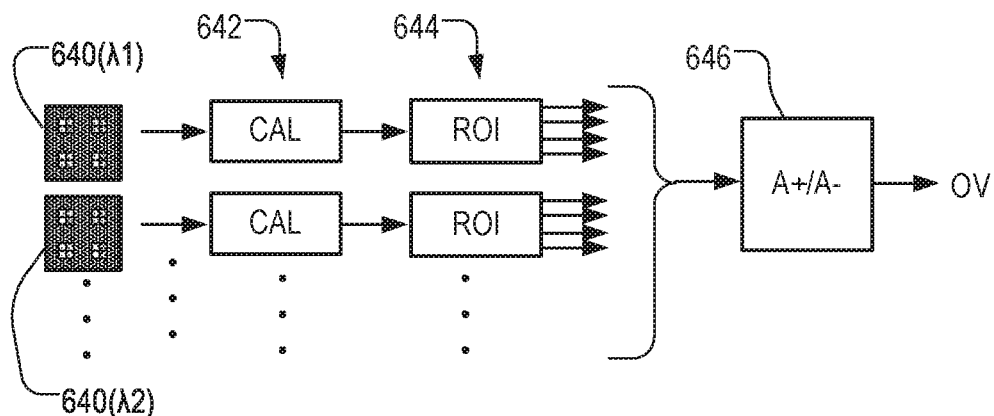

FIG. 6 illustrates (a) a basic known method of deriving asymmetry-related parameters using the inspection apparatus of FIG. 3 and (b) an enhanced method known from US2016161864A1, incorporated herein by reference. The enhanced method of FIG. 6(b) is conveniently referred to as the "A+/A−" method.

The basic method illustrated in FIG. 6(a) is substantially as described above. It is assumed, purely for the sake of example, that the inspection apparatus of FIG. 2 is being used with segmented illumination and segmented detection, as described above. The principles of the present disclosure can be applied just as readily in other arrangements. Diffraction signals are received in the form of a dark-field image 640, which has the form of image 40 shown in FIG.

5. The image is acquired using settings of color, polarization and other parameters, determined in the metrology recipe. Pre-processing step 642 applies calibration settings that have been previously determined for the inspection apparatus. These calibration settings may correct non-uniformities in the image sensor 23, for example.

In a step 644 the captured image is processed to identify the regions of interest (ROIs) and extract diffraction signals in the form of intensity values for the different diffraction orders and different gratings within the target. In step 646 the intensities are combined in the known manner to derive asymmetry values for each grating, and then to combine the asymmetries with the known bias scheme obtain a measurement of overlay OV. The asymmetry values may be obtained by subtracting intensities of +1 and −1 order diffraction signals. The difference in intensity may be normalized by reference to the average intensity, before being used as an asymmetry measure. The step is labeled dI/I to represent this normalized comparison.

In the known enhanced method of FIG. 6(b), the same general sequence of steps is followed, but capturing multiple images 640, each with a different wavelength (color) of radiation, or a different polarization, for example. Images 640 captured with wavelengths λ1 and λ2 are illustrated, purely by way of example. For each image, pre-processing step 642 and signal extraction step 644 are be performed to extract multiple intensities for the opposite diffraction orders of the different gratings, for each color. The asymmetry values for gratings with different bias values are then combined using the A+/A− method described in US2016161864A1, to obtain an overlay measurement OV. This overlay measurement is more robust against process effects, as explained in the prior publication.

The steps of the methods illustrated in FIGS. 6 (a) and (b) may conveniently be implemented by digital signal processing in suitably programmed processing hardware. All the steps may be implemented in a general-purpose processor, or specialist hardware may be provided for one or more of the steps. (The same applies to the enhanced method described below with reference to FIG. 7.) As just described, the known method for combining multiple wavelength data (i.e. the A+/A− method) involves extracting the diffraction signals from each individual image (which corresponds to each of the considered colors). The signal extraction step 644 is the most computationally intensive part of the method. When a full set of image processing operations is required for multiple images, this adversely affects both the computational power required and the complexity of the software architecture. At the same time, image defects impacting accuracy or precision are present in the images due to e.g. sensor asymmetries or contamination, and these are carried out through the overlay computation.

The inventors have recognized that benefit of using multiple capture conditions (colors and/or polarizations, for example) can also be obtained by combining data from multiple capture conditions at the image level. The signal extraction and overlay computation method then need to be applied only on the resulting image. Furthermore, by combining the information at intensity level we are able to reduce these effects before executing the signal extraction and thus improve both accuracy and precision.

FIG. 7 illustrates one embodiment of an enhanced method applying the principles of the present disclosure to measure an asymmetry-related parameter such as overlay. It is assumed, purely for the sake of example, that the inspection apparatus of FIG. 2 is being used with segmented illumination and segmented detection, as described above. The principles of the present disclosure can be applied just as readily in other arrangements.

As in the known method of FIG. 6(b), multiple dark-field images 740 are obtained using the apparatus of FIG. 2, each with a different wavelength (color) or other parameter of radiation. Features corresponding to those of FIG. 6 have similar reference numbers, with prefix '7' instead of '6'. Thus, images 740 captured with wavelengths λ1 and λ2 are illustrated, purely by way of example. Each image is subjected to pre-processing step 742, as in the known method. An image synthesizing step 748 then receives the multiple images 740(λ1) etc. from their pre-processing steps 742, and combines them, still in the form of images, to obtain a single, synthesized image 750.

Signal extraction step 744 and measurement calculation step 746 are provided, which have form similar to that of the basic method of FIG. 6(a). These steps process the synthesized image to obtain a measurement of overlay (or other asymmetry-related parameter). In particular, it will be noted that a single signal extraction step 744 is performed, instead of performing a signal extraction step 644 per image. As will be illustrated below, the image synthesis step 748 can be computationally relatively inexpensive. In the example below, a function $f$ defines the synthesized image as a linear combination (pixel by pixel) of the individual images. Therefore an overall reduction in computational burden can be obtained, while retaining the benefits of using multiple wavelengths method.

The present disclosure does not exclude a "hybrid" method in which groups or subsets of captured images are combined into a plurality of synthesized images, and then signal extraction is performed on a plurality of images, but fewer than the number of capture conditions. For example, a first synthesized image might be a weighted combination of images captured using different colors in combination with a first polarization, while a second synthesized image might be a weighted combination of images captured using different colors in combination with a second polarization. In another embodiment, a first synthesized image might be a weighted combination of images captured using different polarizations and/or angular distributions in combination with a first color, while a second synthesized image might be a weighted combination of images captured using different polarizations and/or angular distributions in combination with a second color.

Processing Detail & Mathematical Examples

We will now illustrate how we can reduce the complexity of the software and the amount of computation by preforming the signal extraction only on the combined image, instead of having to perform the signal extraction step on every image.

As an example we consider the function $f$ to be a linear combination of the input images $740(\lambda_i)$. This means that the synthesized image $\bar{I}$ is computed as:

$$\bar{I} = \Sigma_i w_i I(\lambda_i), \quad (1)$$

where $I(\lambda_i)$ is the (per-pixel intensity of the) dark field image 740 corresponding to an illumination condition $\lambda_i$, i is an index varying over the different illumination conditions and the $w_i$ are weighting coefficients of the linear combination. The weighting coefficients can be chosen based on physical assumptions or as a result of some optimization procedure. Each different illumination condition can be for example a different combination of wavelength and/or polarization. Importantly, coefficients $w_i$ can have both positive and negative values, so that images are effectively subtracted from one another, not only added.

Note that we must assume that the input images are aligned before being combined, meaning that the same pixel position across different images correspond to the same location on the target T and substrate W. Alignment between images from different colors can be achieved via calibrations of the optical system before the images are captured, or via a pre-alignment step (e.g. using normalized cross correlation or any other registration method) before combining the images. This pre-alignment step would be inserted for example between steps 742 and 748 in the method of FIG. 7. Due to the different optical paths followed by the light through the detection system, the images of the gratings can end up in slightly different locations of the image sensor, even if they should nominally be at the same place. In embodiments where diffraction signals are being extracted from pupil images, rather than dark-field images, the diffraction angles of the wanted diffraction orders will change markedly, according to the change of wavelength. A scaling operation may be included as part of a pre-alignment step, scaling the diffraction pattern in accordance with the wavelength.

Having generated the synthesized image $\bar{I}$, synthesized diffraction signals $\bar{I}^{+1}$ and $\bar{I}^{-1}$ for each grating or other target structure can be extracted from the synthesized image. Each synthesized diffraction signal automatically comprises the same weighted combination of diffraction signals obtained under different capture conditions.

A commonly used overlay computation method assumes that the asymmetry between the +1 and −1 order images is proportional to the sine of overlay:

$$I^{+1} - I^{-1} = K(OV), \quad (2)$$

where $I^{+1}$ and $I^{-1}$ are the +1 and −1 order diffraction signals and K is a coefficient representing the sensitivity of the overlay measurement and depends on both stack and sensor parameters. Models of the relationship other than a linear model (e.g. sinusoidal) can be adopted, if preferred. As has already been mentioned, a normalization factor, not illustrated in these equations, may be applied in practice:

$$2 \frac{I^{+1} - I^{-1}}{I^{+1} + I^{-1}} = K(OV), \quad (2')$$

where ½ $(I^{+1}+I^{-1})$ is the average of the intensities that are being compared. This normalization is omitted from the equations only for conciseness.

Note that the same assumption holds if we consider a synthesized image constructed as in Equation (1):

$$\bar{I}^{+1} - \bar{I}^{-1} = \sum_i w_i I^{+1}(\lambda_i) - \sum_i w_i I^{-1}(\lambda_i) = \sum_i w_i (I^{+1}(\lambda_i) - I^{-1}(\lambda_i)) = \sum_i w_i (K(\lambda_i)(OV))$$

$$= \left( \sum_i w_i K(\lambda_i) \right)(OV) = \bar{K}(OV).$$

Thus, as the asymmetry $\bar{I}^{+1} - \bar{I}^{-1}$ derived from the synthesized image is proportional to the overlay (in a linear model example), we can still use our current overlay signal extraction and overlay computation methods over the combined images. Note that the sensitivity $\bar{K}$ of the overlay measurement will now be:

$$\bar{K} = \sum_i w_i K(\lambda_i).$$

Several advantages can be seen for the enhanced techniques disclosed herein and represented schematically in FIG. 7. The techniques are flexible, in that the designer can choose the coefficients $w_i$ as part of a metrology recipe, based either on physical assumptions or as a result of an optimization problem such that we can improve sensitivity, stack sensitivity or any other performance parameter that is of interest. The method is simple and it requires minimal changes to the processing hardware and software. As demonstrated in the following example, an existing, basic signal extraction method works without any modification on the synthesized images.

As another benefit, many of the key performance indicators (KPI's) (for example, stack sensitivity) that are commonly used to evaluate metrology techniques can be computed in the same way as we compute them for single color acquisitions. This is not the case in other enhanced methods, where there may be no obvious "right way" to define many of these KPI's.

Example Using Two Colors

Rather than defining the multiple capture conditions (for example illumination conditions) at random, they can be selected to maximize the benefit of the enhanced method for a given number of image captures. For example, if we choose synthesized image intensity $\bar{I}$ to be a linear combination of just two images, we may wish to select the colors and the coefficients $w_i$ i=1, 2 such that we can maximize the combined sensitivity $\bar{K}$. For this it might be useful to observe the typical behavior of the so-called "swing curve" which is obtained by plotting K as a function of the wavelength.

FIG. 8 illustrates such a swing curve 802, which represents the variation of sensitivity coefficient K over wavelength λ, as an example of a parameter that can be varied to create different capture conditions. Assuming K is normalized by dose (i.e. all images have received the same number of photons), we propose to capture images at peaks of the swing curve with opposite signs. We then subtract the images to obtain the synthesized image. In terms of equation 1, this subtraction is obtained by setting the weighting coefficients so that $w_2 = -w_1 = 1$.

In such a case, the resulting sensitivity $\bar{K}$ will be:

$$\bar{K} = |K_1| + |K_2|.$$

The asymmetries for the positive biased gratings and the negative biased gratings will be equal to:

$$\bar{A}^+ = A^+(\lambda_2) - A^+(\lambda_1),$$

$$\bar{A}^- = A^-(\lambda_2) - A^-(\lambda_1).$$

Then, overlay is computed as:

$$OVL = \frac{1}{bias} \frac{\bar{A}^+ + \bar{A}^-}{\bar{A}^+ - \bar{A}^-},$$

where 'bias' is the magnitude of the positive and negative biases.

It will be understood that the two capture conditions can be selected in advance and be the only two capture conditions used, or they may be selected from a larger number of capture conditions, by setting coefficients in the image synthesizing step 748. The former approach may of course be beneficial where image acquisition time per capture is a significant part of the measurement overhead. The latter approach may be preferred when the optimum recipe is not necessarily known in advance.

Using the equations above, it can also be shown that subtracting the images corresponding to these two colors and then applying the overlay computation on the resulting synthesized image, by the method of FIG. 7, is mathematically equivalent to applying the known A+/A− method of FIG. 6(*b*) with two colors. The A+/A− method is illustrated in FIG. 9. As explained more fully in US2016161864A1, for a single overlay target of the type illustrated in FIG. 4, we plot for different capture conditions (e.g. different colors) the measured asymmetry A+ of the grating having positive bias versus the measured asymmetry A− of the grating having negative bias. As shown in FIG. 9(*a*), the empirical observation underlying the A+/A− method is that these points 902($\lambda_i$) lie approximately on a line 904, and the slope m of this line is related to overlay as follows:

$$OVL = \frac{1}{\text{bias}}\left(\frac{m+1}{m-1}\right).$$

The slope of the line can be found for any number of points using, for example, a "least squares" fit. In this way, any number of points (capture conditions) can be used to obtain a "best" measurement of overlay (or other asymmetry-related parameter). Referring now to FIG. 9(*b*), we consider an example using only two points (for two different colors $\lambda_1$ and $\lambda_2$). In that case, the slope m of line 906 is simply given by:

$$m = \frac{A^+(\lambda_2) - A^+(\lambda_1)}{A^-(\lambda_2) - A^-(\lambda_1)}.$$

Combining the last two equations and operating, we have that overlay can be computed as:

$$OVL = \frac{1}{\text{bias}} \frac{(A^+(\lambda_2) - A^+(\lambda_1)) + (A^{-1}(\lambda_2) - A^-(\lambda_1))}{(A^+(\lambda_2) - A^+(\lambda_1)) - (A^{-1}(\lambda_2) - A^-(\lambda_1))}.$$

This is exactly the formula for overlay obtained for the in case where we subtract the two images as shown in the previous section. Note also that we plot the (A$^+$−A$^-$) axis 908 in FIG. 9(*b*). A position projected onto this axis represents the value of coefficient K. We can see that choosing two points which are as far as possible in the (A+, A−) plane is in general equivalent to choosing points at peaks of the swing curve with opposite signs.

Experimental Results

Experimental results confirm the benefits described above. The method of FIG. 7 was applied to images captured from overlay targets on a typical product-like wafer. Combining measurements by the A+/A− method for six different colors, a reference measurement OVref was obtained for each target. Then for each wavelength there were calculated differences between obtained overlay measurements OV for each target and the "ideal" reference measurement OVref.

The best measurements obtainable by a single wavelength each showed a systematic deviation from the reference measurement per target, and a clear variation between targets. Two wavelengths $\lambda 1$ and $\lambda 2$ are at peaks with opposite sign of the swing curve were selected and used in the synthesized image method disclosed herein to combine images captured with those two wavelengths and obtain overlay measurements. Measurements were also obtained using A+A− method with the same two colors. It was found that the synthesized image method greatly improves matching to the ideal result OVref, when compared with any of the best single-color measurements. The experiment also confirmed the mathematically-expected result that the results are as good as A+/A− method using the same two colors. Therefore, the benefit of reduced computation is obtained with no loss of accuracy. Secondly, we expect that by subtracting the images with opposite stack sensitivities one can partially remove artifacts that are present in both images.

In other experiments, the technique is proved useful for thick stacks, which are found for example in modern 3-D NAND devices. In thick stacks, the swing curves oscillate very rapidly with wavelength. This behavior makes it difficult to obtain sufficient stack sensitivity for accurate measurements. It was observed that, in many thick stack cases, the 0 and 90-degree polarization have opposite sign for stack sensitivity. Then if we subtract images obtained using the 0 and 90-degree polarization in the capture conditions, we have areas where the stack sensitivity will be above the level required for measurement, and also the 'swings' will be slightly wider.

The examples presented use two capture conditions, with a simple subtraction, but the method can be extended to more colors and/or different weighting coefficients if needed. The way of selecting the capture conditions and the coefficient can differ according to the characteristics of the product.

The examples presented use a bias scheme of only two bias values, equal in magnitude and opposite in direction. The method can be extended to bias schemes with different bias vales, and to bias schemes with more than two values, and to targets with overlay and bias values in more than one direction.

Application in Lithographic Manufacturing Process

FIG. 10 illustrates the application a metrology, in the control of a lithographic manufacturing system of the type illustrated in FIG. 1. The steps will be listed here, and then explained in more detail:

S21: Process wafer to produce structures on substrate

S22: Measure overlay and/or other parameter across substrate

S23: Update metrology recipe

S24: Update lithography and/or process recipe

At step S21, structures are produced across a substrate using the lithographic manufacturing system. At S22, the metrology apparatus 140 and optionally other metrology apparatus and information sources are used to measure a property of the structures across the substrate. Diffraction signals are captured using multiple capture conditions, as described above and as shown for example in FIG. 7. One or more synthesized images are obtained and used to derive an asymmetry-related property of a structure. An asymmetry-related property we are interested in may be OVL (overlay) and/or focus and/or dose, for example.

At step S23, optionally, metrology recipes and calibrations of the metrology apparatus are updated in light of the measurement results obtained. The recipes may for example specify which particular capture conditions to use in future, and/or how they are to be combined.

At step S24, the measurements of overlay or other parameters are compared with desired values, and used to update settings of the lithographic apparatus and/or other apparatus within the lithographic manufacturing system. By providing a metrology apparatus using synthesized images, more accurate measurements can be obtained for a given processing burden. This in turn can lead to better performance when the results of measurements are applied in further measurements and in further control of the lithographic apparatus.

CONCLUSION

The principles disclosed above allow measurement accuracy to be improved by the use of multiple capture conditions, without proportionately increasing the computational burden. The technique is suitable for application in asymmetry measurements to be made by dark field imaging methods, using segmented detection systems, as well as other methods. Use of two or more sets of capture conditions, and/or two or more different designs of target structure allows the simple and efficient inspection apparatus based on a segmented detection system to operate with a wider range of target designs, including those having significant diffraction in a second direction in both layers.

At the same time, image defects impacting accuracy or precision are generally present in the images due, for example, to sensor asymmetries or contamination, and these are carried out through the overlay computation. We expect that by combining the information at intensity level we are able to reduce these effects before executing the signal extraction and thus improve both accuracy and precision.

While specific embodiments of the invention have been described above, it will be appreciated that the invention may be practiced otherwise than as described.

While the inspection apparatus or tool illustrated in the embodiments comprises a particular form of scatterometer having first and second branches for simultaneous imaging of pupil plane and substrate plane by parallel image sensors, alternative arrangements are possible. Rather than provide two branches permanently coupled to objective lens 16 with beam splitter 17, the branches could be coupled selectively by a movable optical element such as a mirror. The optical system could be made having a single image sensor, the optical path to the sensor being reconfigured by movable elements to serve as a pupil plane image sensor and then a substrate plane image sensor.

While the optical system illustrated in FIG. 2 comprises refractive elements, reflective optics can be used instead. For example, the use of reflective optics may enable the use of shorter wavelengths of radiation.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the inspection apparatus hardware and suitable target structures realized on patterning devices and on patterned substrates, an embodiment may include a processing device implementing the steps of the method. The processing device may be a single processor, or a collection of processors working together in parallel and/or sequentially. This processing device may be controlled in whole or in part by a computer program containing one or more sequences of machine-readable instructions implementing methods of measurement of the type illustrated above to obtain information about a target structure and/or about a lithographic process. This computer program may be executed, for example, within image processor and controller PU in the apparatus of FIG. 2 and/or the control unit LACU of FIG. 1. There may also be provided a data storage medium (e.g., semiconductor memory, magnetic or optical disk) having such a computer program stored therein.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further embodiments according to the invention are further described in below numbered clauses:

1. A method of determining a performance parameter of a process, the method including the following steps:

(a) obtaining a plurality of target structures that have been formed by the process, each target structure having a known bias related to said performance parameter, (b) using a detection system to capture a plurality of images representing selected portions of radiation diffracted by the target structures under a plurality of different capture conditions;

(c) combining pixel values of at least a subset of the captured images to obtain one or more synthesized images;

(d) extracting a plurality of synthesized diffraction signals from the synthesized image or images; and (e) using the synthesized diffraction signals to calculate a measurement of said performance parameter.

2. A method according to clause 1 wherein the plurality of capture conditions differ in one or more of the wavelength, polarization, and/or angular distribution of radiation used for illumination of the target structures and/or detection of the captured images.

3. A method according to clause 2 wherein the plurality of capture conditions differ at least in the wavelength of radiation used for illumination of the target structures and/or detection of the captured images.

4. A method according to clause 2 or 3 wherein the plurality of capture conditions differ at least in the polarization of radiation used for illumination of the target structures and/or detection of the captured images.

5. A method according to any preceding clause wherein the synthesized image is generated in step (c) by a weighted combination of pixel values from the captured images, using a positive weight for at least one of the captured images and a negative weight for at least another one of the captured images.

6. A method according to any preceding clause wherein step (e) includes obtaining asymmetry values for two or more target structures by combining two or more of the synthesized diffraction signals extracted in step (d).

7. A method according to any preceding clause wherein step (d) comprises extracting a plurality of synthesized diffraction signals from respective portions of one or more synthesized images.

8. A method according to clause 7 wherein said captured images are pupil images representing a distribution of diffracted radiation in a pupil plane of the detection system.

9. A method according to clause 7 wherein said captured images are dark-field images of the plurality of target structures, each dark-field image being formed using specific portions of diffracted radiation.

10. A method according to clause 9 wherein each of said captured images contains complementary portions which are images of the same plurality of target structures formed using opposite diffraction orders of radiation diffracted in the first and second directions.

11. A method according to clause 7, 8, 9 or 10 wherein in step (b) said images are captured while illuminating the target structures using a segmented illumination profile having illuminated regions and dark regions, each illuminated region being symmetrically opposite a dark region, when reflected in the first direction and when reflected in the second direction.

12. A method according to clause 11 wherein said segmented illumination profile has four quadrants, said illuminated regions falling only within two quadrants diametrically opposite one another.

13. A method according to clause 11 or 12 when dependent on clause 9 or 10, wherein said detection system is a segmented detection system, whereby the or each first image and the or each second image, includes complementary portions which are images of the target structure structures formed using opposite diffraction orders of the radiation diffracted by the target structure.

14. A method according to any of clauses 7 to 13 wherein the performance parameter is overlay and each of said target structures is an overlay grating formed in two or more layers.

15. A method according to of clauses 7 to 14 wherein said plurality of target structures comprises four target structures arranged together in a rectangular layout divided into similar quarters.

16. A method according to any preceding clause further comprising using the determined performance parameter to modify a metrology recipe for measuring further target structures.

17. A method according to any preceding clause further comprising using the determined performance parameter to control a lithographic apparatus to apply patterns to substrates.

18. An inspection apparatus for determining a performance parameter of a process, the inspection apparatus comprising:
a support for a substrate on which are provided a plurality of target structures that have been formed by the process, each target structure having a known bias related to said performance parameter,
an illumination system and a detection system which are together operable to capture images representing selected portions of radiation diffracted by the target structures under a plurality of different capture conditions;
a processing device arranged to combine pixel values of at least a subset of the captured images to obtain one or more synthesized images, to extract a plurality of synthesized diffraction signals from the synthesized image or images, and to use the synthesized diffraction signals to calculate a measurement of said performance parameter.

19. An inspection apparatus according to clause 18 wherein the plurality of capture conditions can be arranged to differ in at least one of the wavelength, polarization, and angular distribution of radiation used for illumination of the target structures or in at least one of the wavelength, polarization, and angular distribution of radiation used for detection of the captured images.

20. An inspection apparatus according to clause 18 or 19 wherein the processing device is arranged to generate the synthesized image by a weighted combination of pixel values from the captured images, using a positive weight for at least one of the captured images and a negative weight for at least another one of the captured images.

21. An inspection apparatus according to any of clauses 18 to 20 wherein the processing device is arranged to obtain asymmetry values for two or more target structures by combining two or more of the extracted synthesized diffraction signals, the asymmetry values being used to calculate the measurement of said performance parameter.

22. An inspection apparatus according to any of clauses 18 to 21 wherein the processing device is arranged to extract the plurality of synthesized diffraction signals from respective portions of one or more synthesized images.

23. An inspection apparatus according to clause 22 wherein said captured images are dark-field images of the plurality of target structures, each dark-field image being formed using specific portions of diffracted radiation.

24. An inspection apparatus according to clause 23 wherein each of said captured images contains complementary portions which are images of the same plurality of target structures formed using opposite diffraction orders of radiation diffracted in the first and second directions.

25. A processing device arranged to receive a plurality of images captured from a plurality of target structures under different capture conditions and to derive a measurement of a performance parameter by combining pixel values of at least a subset of the captured images to obtain one or more synthesized images, extracting a plurality of synthesized diffraction signals from the synthesized image or images, and using the synthesized diffraction signals to calculate a measurement of said performance parameter.

26. A computer program product comprising machine readable instructions for causing a programmable processing device to receive a plurality of images captured from a plurality of target structures under different capture conditions and to derive a measurement of a performance parameter by performing the steps (c), (d) and (e) in the method of any of clauses 1 to 17.

27. A computer program product according to clause 26 wherein said machine readable instructions are further arranged to cause the programmable processing device to control automatically the operation of an inspection apparatus to cause capture of the images under different capture conditions by step (b) of the method.

28. A lithographic system comprising:
a lithographic apparatus for applying a pattern onto one or more substrates;
an inspection apparatus according to any of clauses 17 to 24; and
a control system for controlling the lithographic apparatus using the measurement results from the inspection apparatus, when applying the pattern to further substrates.

29. A method of manufacturing devices wherein a device pattern is applied to a series of substrates using a process, the method including overlay error using a plurality of target structures formed as part of or beside said device pattern on at least one of said substrates using a method according to any of clauses 1 to 17, and controlling the process for later substrates in accordance with the result of the measuring.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams. Implementations of scatterometers and other inspection apparatus can be made in UV and EUV wavelengths using suitable sources, and the present disclosure is in no way limited to systems using IR and visible radiation.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A method of determining a performance parameter of a process comprising:
obtaining a plurality of target structures that have been formed by the process, each target structure having a known bias related to the performance parameter,
using a detection system to capture a plurality of images representing selected portions of radiation diffracted by the target structures under a plurality of capture conditions;
combining pixel values of at least a subset of the captured images to obtain one or more synthesized images;
extracting a plurality of synthesized diffraction signals from the one or more synthesized images; and
using the synthesized diffraction signals to calculate a measurement of the performance parameter.

2. The method of claim 1, wherein the plurality of capture conditions differ in one or more of wavelength, polarization, and/or angular distribution of radiation used for illumination of the target structures and/or detection of the captured images.

3. The method of claim 2, wherein the plurality of capture conditions differ at least in the wavelength of radiation used for illumination of the target structures and/or detection of the captured images.

4. The method of claim 2, wherein the plurality of capture conditions differ at least in the polarization of radiation used for illumination of the target structures and/or detection of the captured images.

5. The method of claim 1, wherein the one or more synthesized images are generated by a weighted combination of pixel values from the captured images, using a positive weight for at least one of the captured images and a negative weight for at least another one of the captured images.

6. The method of claim 1, wherein the using the synthesized diffraction signals includes obtaining asymmetry values for two or more target structures by combining two or more of the synthesized diffraction signals.

7. The method of claim 1, wherein the extracting comprises extracting the plurality of synthesized diffraction signals from respective portions of the one or more synthesized images.

8. A method of claim 7, wherein the captured images are pupil images representing a distribution of diffracted radiation in a pupil plane of the detection system.

9. The method of claim 7, wherein the captured images are dark-field images of the plurality of target structures, each dark-field image being formed using specific portions of diffracted radiation.

10. The method of claim 9, wherein each of the captured images contains complementary portions which are images of the same plurality of target structures formed using opposite diffraction orders of radiation diffracted in a first and second direction.

11. The method of claim 7, wherein when using the detection system the images are captured while illuminating the target structures using a segmented illumination profile having illuminated regions and dark regions, each illuminated region being symmetrically opposite a dark region, when reflected in a first direction and when reflected in a second direction.

12. The method of claim 11, wherein the segmented illumination profile has four quadrants, the illuminated regions falling only within two quadrants diametrically opposite one another.

13. The method of claim 11, wherein the detection system is a segmented detection system, wherein a first image and a second image includes complementary portions which are images of the target structures formed using opposite diffraction orders of the radiation diffracted by the target structure.

14. The method of claim 7, wherein the performance parameter is overlay and each of the target structures is an overlay grating formed in two or more layers.

15. The method of claim 7, wherein the plurality of target structures comprises four target structures arranged together in a rectangular layout divided into similar quarters.

16. An inspection apparatus for determining a performance parameter of a process, the inspection apparatus comprising:
a support configured to support a substrate on which are provided a plurality of target structures that have been formed by the process, each target structure having a known bias related to the performance parameter,
an illumination system and a detection system which are together operable to capture a plurality of images representing selected portions of radiation diffracted by the target structures under a plurality of capture conditions; and
a processing device arranged to:
combine pixel values of at least a subset of the captured images to obtain one or more synthesized images,
extract a plurality of synthesized diffraction signals from the one or more synthesized images, and
use the synthesized diffraction signals to calculate a measurement of the performance parameter.

17. The inspection apparatus according to claim 16, wherein the plurality of capture conditions are arranged to differ in at least one of wavelength, polarization, and angular distribution of radiation used for illumination of the target structures or in at least one of wavelength, polarization, and angular distribution of radiation used for detection of the captured images.

18. A non-transitory computer program product comprising machine readable instructions for causing a programmable processing device to receive a plurality of images captured from a plurality of target structures under different capture conditions and to derive a measurement of a performance parameter by performing operations comprising:
obtaining a plurality of target structures that have been formed by the process, each target structure having a known bias related to the performance parameter, using a detection system to capture a plurality of images representing selected portions of radiation diffracted by the target structures under a plurality of capture conditions;

combining pixel values of at least a subset of the captured images to obtain one or more synthesized images;

extracting a plurality of synthesized diffraction signals from the one or more synthesized images; and using the synthesized diffraction signals to calculate a measurement of the performance parameter.

19. A lithographic system comprising:

a lithographic apparatus for applying a pattern onto one or more substrates;

an inspection apparatus for determining a performance parameter of a process, the inspection apparatus comprising:

a support configured to support a substrate on which are provided a plurality of target structures that have been formed by the process, each target structure having a known bias related to the performance parameter, an illumination system and a detection system which are together operable to capture a plurality of images representing selected portions of radiation diffracted by the target structures under a plurality of capture conditions; and a processing device arranged to:

combine pixel values of at least a subset of the captured images to obtain one or more synthesized images, extract a plurality of synthesized diffraction signals from the one or more synthesized images, and use the synthesized diffraction signals to calculate a measurement of the performance parameter; and a control system for controlling the lithographic apparatus using the measurement from the inspection apparatus, when applying the pattern to further substrates.

20. A method of manufacturing devices wherein a device pattern is applied to a series of substrates using a process, the method comprising:

determining overlay error using a plurality of target structures formed as part of or beside the device pattern on at least one of the substrates using a method comprising:

obtaining a plurality of target structures that have been formed by the process, each target structure having a known bias related to the performance parameter, using a detection system to capture a plurality of images representing selected portions of radiation diffracted by the target structures under a plurality of capture conditions;

combining pixel values of at least a subset of the captured images to obtain one or more synthesized images;

extracting a plurality of synthesized diffraction signals from the one or more synthesized images; and using the synthesized diffraction signals to calculate a measurement of the performance parameter; and controlling the process for later substrates in accordance with the result of the measurement.

* * * * *

UNITED STATES PATENT AND TRADEMARK OFFICE
CERTIFICATE OF CORRECTION

PATENT NO. : 10,564,552 B2
APPLICATION NO. : 16/007112
DATED : February 18, 2020
INVENTOR(S) : Sanguinetti et al.

Page 1 of 1

It is certified that error appears in the above-identified patent and that said Letters Patent is hereby corrected as shown below:

In the Claims

In Column 25, Line 65, Claim 23, replace "A method" with --The method--.

In Column 26, Lines 22-23, Claim 28, replace "a first image and a second image includes" with --a first image and a second image include--.

Signed and Sealed this
Twenty-eighth Day of July, 2020

Andrei Iancu
*Director of the United States Patent and Trademark Office*